United States Patent
Watanabe et al.

(10) Patent No.: US 9,346,171 B2
(45) Date of Patent: May 24, 2016

(54) SUBSTRATE TRANSPORT APPARATUS, AND SYSTEM AND METHOD FOR MANUFACTURING ELECTRONIC DEVICE

(71) Applicant: CANON ANELVA CORPOREATION, Kanagawa-ken (JP)

(72) Inventors: Kazuhito Watanabe, Tama (JP); Yukihito Tashiro, Chofu (JP); Satoshi Nakamura, Tama (JP); Daisuke Kobinata, Tokyo (JP); Toshiaki Sasaki, Tokorozawa (JP); Naoyuki Nozawa, Inagi (JP)

(73) Assignee: CANON ANELVA CORPORATION, Kanagawa-ken (JP)

( * ) Notice: Subject to any disclaimer, the term of this patent is extended or adjusted under 35 U.S.C. 154(b) by 630 days.

(21) Appl. No.: 13/752,738

(22) Filed: Jan. 29, 2013

(65) Prior Publication Data

US 2013/0202398 A1 Aug. 8, 2013

Related U.S. Application Data (63) Continuation of application No. PCT/JP2010/005082, filed on Aug. 17, 2010.

(51) Int. Cl.
*B25J 9/10* (2006.01)
*B25J 11/00* (2006.01)
(Continued)

(52) U.S. Cl.
CPC *B25J 11/00* (2013.01); *B25J 9/107* (2013.01); *B25J 11/0095* (2013.01); *H01L 21/67742* (2013.01); *H01L 21/68707* (2013.01)

(58) Field of Classification Search
CPC .................................................. B25J 9/107
See application file for complete search history.

(56) References Cited

U.S. PATENT DOCUMENTS

| | | | |
|---|---|---|---|
| 6,132,165 | A | 10/2000 | Carducci |
| 6,158,941 | A | 12/2000 | Muka et al. |
| 6,299,404 | B1 | 10/2001 | Muka et al. |

(Continued)

FOREIGN PATENT DOCUMENTS

| | | |
|---|---|---|
| CN | 1487578 A | 4/2004 |
| CN | 101262986 A | 9/2008 |

(Continued)

OTHER PUBLICATIONS

Dec. 26, 2014 Chinese Office Action in Chinese Patent Application No. 201080068599.2.

(Continued)

*Primary Examiner* — Ernesto Suarez
*Assistant Examiner* — Ronald Jarrett
(74) *Attorney, Agent, or Firm* — Fitzpatrick, Cella, Harper & Scinto (57) ABSTRACT

A substrate transport apparatus including a first substrate holder and a second substrate holder capable of respectively holding substrates includes a first drive arm which has first and second end portions, and is rotatable with rotation of a first drive shaft, a second drive arm which has a third end portion spaced apart from the first end portion by a first distance, and a fourth end portion spaced apart from the second end portion by a second distance, and is rotatable with rotation of a second drive shaft coaxial with the first drive shaft, two first driven arms coupled to the first substrate holder, and two second driven arms coupled to the second substrate holder.

8 Claims, 7 Drawing Sheets

(51) Int. Cl.
*H01L 21/677* (2006.01)
*H01L 21/687* (2006.01)

(56) References Cited

U.S. PATENT DOCUMENTS

| | | | |
|---|---|---|---|
| 6,988,867 B2 | 1/2006 | Saeki et al. | |
| 7,572,093 B2 | 8/2009 | Minami et al. | |
| 2004/0062632 A1* | 4/2004 | Saeki et al. | 414/744.5 |
| 2005/0232744 A1* | 10/2005 | Minami et al. | 414/744.1 |
| 2007/0020082 A1 | 1/2007 | Caveney et al. | |

FOREIGN PATENT DOCUMENTS

| | | |
|---|---|---|
| JP | 11-207666 A | 8/1999 |
| JP | 11-216691 A | 8/1999 |
| JP | 11-514303 | 12/1999 |
| JP | 2000-503478 | 3/2000 |
| JP | 2002-503561 | 2/2002 |
| KR | 10-1999-0077353 A | 10/1999 |
| KR | 10-2006-0045058 A | 5/2006 |
| WO | 97/15423 | 5/1997 |
| WO | 97/26117 | 7/1997 |
| WO | 99/42256 | 8/1999 |

OTHER PUBLICATIONS

International Search Report dated Sep. 28, 2010, and International Preliminary Report on Patentability dated May 31, 2011.
Apr. 29, 2014 Korean Notice of Allowance in Korean Application 10-2013-7006623.
Chinese Office Action issued in Chinese Application No. 201080068599.2, dated Sep. 14, 2015.

* cited by examiner

SUBSTRATE TRANSPORT APPARATUS
(DURING EXTENSION OF FIRST SUBSTRATE HOLDER)

FIG. 7B

LOWER SUBSTRATE IS OUT OF SIGHT

SUBSTRATE TRANSPORT APPARATUS
(DURING REVOLUTION: RETRACTED POSITION)

SUBSTRATE TRANSPORT APPARATUS, AND SYSTEM AND METHOD FOR MANUFACTURING ELECTRONIC DEVICE

This application is a continuation of PCT Application No. PCT/JP2010/005082, filed on Aug. 17, 2010

TECHNICAL FIELD

The present invention relates to a substrate transport apparatus, and a system and method for manufacturing an electronic device.

BACKGROUND ART

Figure 7A:
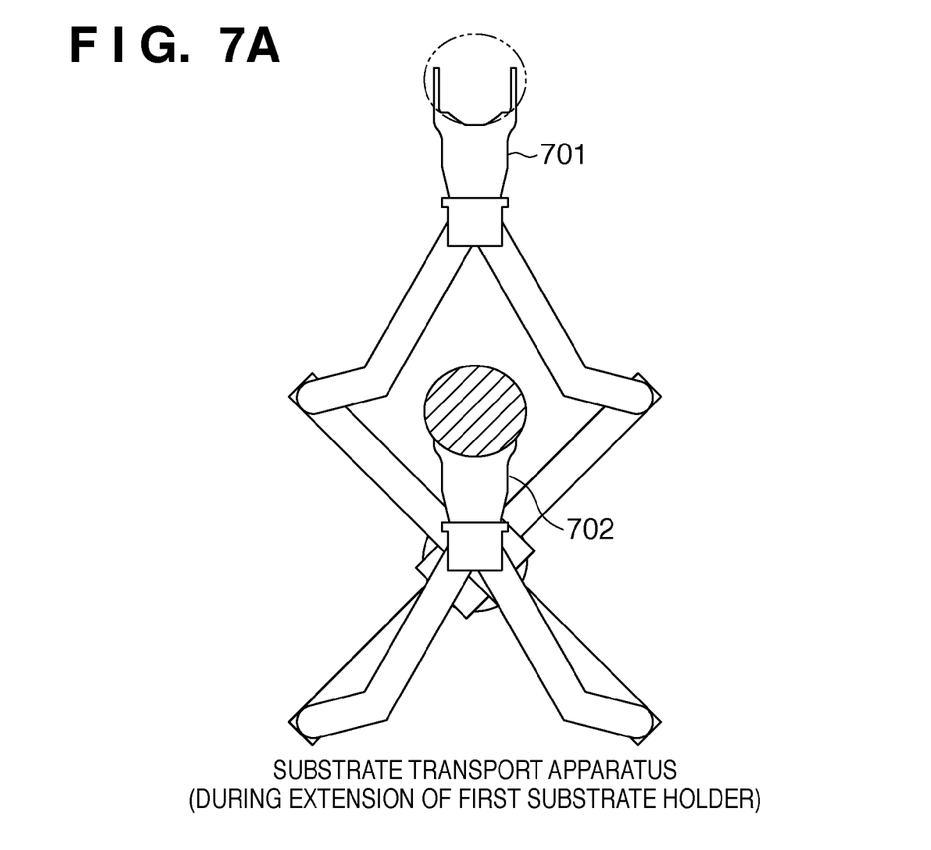
FIG. 7A is a view for explaining an example of the arrangement of the conventional substrate transport apparatus.
Figure 7B:
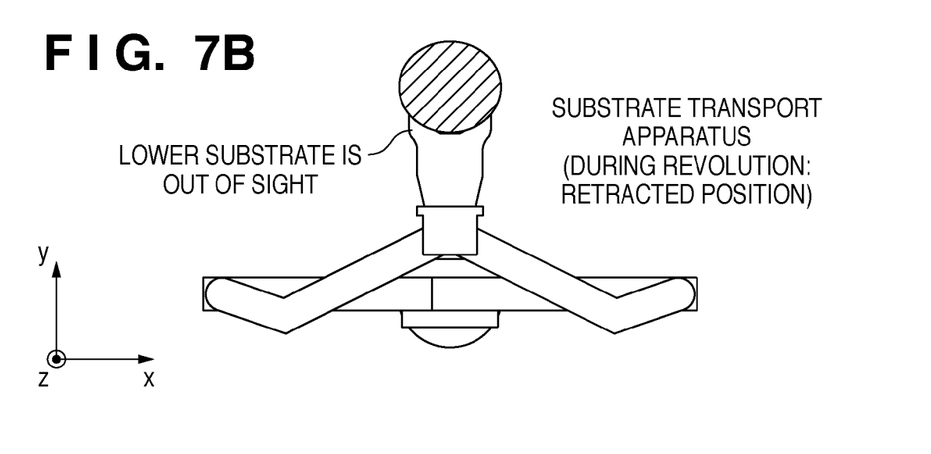
FIG. 7B is a view for explaining the example of the arrangement of the conventional substrate transport apparatus.

An example of the arrangement of a conventional substrate transport apparatus will be described with reference to FIGS. 7A and 7B. The conventional substrate transport apparatus includes an arm unit capable of transforming the rotary motion of a drive source into a rectilinear motion. The arm unit includes two substrate holders aligned vertically (in the Z-direction), which respectively serve as a first substrate holder 701 and a second substrate holder 702.

For example, the moment a predetermined process is completed in a specific process chamber while an unprocessed substrate is mounted on the second substrate holder 702, the substrate transport apparatus rotates toward the process chamber in order to recover the processed substrate. The first substrate holder 701 on which no substrate is mounted moves toward the process chamber (FIG. 7A), receives the processed substrate in the process chamber, and returns the first substrate holder 701 to the retracted position (FIG. 7B).

To prevent any problem that may occur when the next process is successively performed without reliably transporting the processed substrate, the conventional substrate transport apparatus uses a sensor to detect the presence/absence of a substrate before and after a substrate exchange operation. It is determined based on this detection result whether a substrate has been reliably transported to the process chamber. In recovering a processed substrate, first, the substrate transport apparatus uses a sensor to confirm whether no substrate is present on the substrate holder for substrate recovery, and moves the substrate holder toward the process chamber after it confirms that no substrate is present on this substrate holder (see PTL1 and PTL2).

CITATION LIST

Patent Literature

PTL1: Japanese Patent Laid-Open No. 11-514303
PTL2: Japanese Patent Laid-Open No. 11-207666

SUMMARY OF INVENTION

Technical Problem

However, when the substrate transport apparatus disclosed in PTL1 is viewed from the top in the Z-direction, the first substrate holder 701 and second substrate holder 702 overlap each other. When a substrate is held on the first substrate holder 701, another substrate on the second substrate holder 702 positioned below the first substrate holder 701 cannot be viewed from vertically above in the Z-direction. Also, when a substrate is held on the second substrate holder 702, another substrate on the first substrate holder 701 positioned above the second substrate holder 702 cannot be viewed from vertically below in the Z-direction.

As a measure for allowing detection of the presence/absence of substrates on substrate holders overlapping each other in the Z-direction, it is possible to capture an image of the substrate holder from an oblique direction, and detect a substrate using a high-resolution, high-cost CCD sensor and image processing apparatus. This measure not only raises the cost of the substrate transport apparatus, but also prolongs the tact time of the substrate transport apparatus because it is necessary to perform image processing and determine the presence/absence of a substrate based on the image processing result.

As another measure for allowing detection of the presence/absence of a substrate, it is possible to employ an operation step of intentionally advancing/retreating either substrate holder from vertically above (or below) to a position that allows detection. In this measure as well, the tact time of the substrate transport apparatus prolongs because the operation step of advancing/retreating either substrate holder is added.

An arrangement (PTL2) capable of monitoring a robot arm using a sensor requires a member with a special shape (boss member). In the transport operation of the robot arm, it is also necessary to curve the arm shape so as to prevent the robot arm from interfering with the boss member, leading to a rise in cost of the substrate transport apparatus.

Solution to Problem

The present invention has been made in consideration of the above-mentioned problem, and has as its object to provide a substrate transport technique which can efficiently detect whether a substrate is held on each of a plurality of substrate holders.

According to an aspect of the present invention, there is provided a substrate transport apparatus comprising:
a first substrate holder and a second substrate holder capable of respectively holding substrates;
two first driven arms, one end of each of which is coupled to the first substrate holder;
two second driven arms, one end of each of which is coupled to the second substrate holder;
a first drive arm to which one of the two first driven arms and one of the two second driven arms are coupled;
a second drive arm to which the other of the two first driven arms and the other of the two second driven arms are coupled;
a first drive shaft to which the first drive arm is rotatably coupled; and
a second drive shaft which is coaxial with the first drive shaft, and to which the second drive arm is rotatably coupled, independently of the first drive shaft,
wherein the first drive arm including a first coupling portion to which the other end of the one of the two first driven arms is coupled to one end of the first drive arm, and a second coupling portion to which the other end of the one of the two second driven arms is coupled to the other end of the first drive arm, and
the second drive arm including a third coupling portion to which the other end of the other of the two first driven arms is coupled to one end of the second drive arm, and a fourth coupling portion to which the other end of the other of the two second driven arms is coupled to the other end of the second drive arm,
in a case where the first drive arm and the second drive arm rotate in an opposite direction, the one substrate holder of the first substrate holder and the second substrate holder, advances in a direction in which the one substrate holder separates from the rotation axis of the first drive shaft, and the other substrate holder of the first substrate holder and the second substrate holder, retreats in a direction in which the other substrate holder returns to the rotation axis of the first drive shaft, a first direction axis defined by a straight line which connects the first coupling portion and the second coupling portion to each other is spaced apart from a rotation axis of the first drive shaft by a first distance, and a second direction axis defined by a straight line which connects the third coupling portion and the fourth coupling portion to each other is spaced apart from a rotation axis of the second drive shaft by a second distance.

According to another aspect of the present invention, there is provided a system for manufacturing an electronic device, comprising:

the above-mentioned substrate transport apparatus; and
at least one process apparatus which executes a device manufacturing process for a substrate transported by the substrate transport apparatus.

According to still another aspect of the present invention, there is provided a method of manufacturing an electronic device, comprising:

a transport step of transporting a substrate using the above-mentioned substrate transport apparatus; and a process execution step of executing a device manufacturing process for the substrate, transported in the transport step, in at least one process apparatus.

Advantageous Effects of Invention

According to the present invention, it is possible to efficiently detect whether a substrate is held on each of a plurality of substrate holders. More specifically, according to the present invention, it is possible to detect whether a substrate is held on each of a plurality of substrate holders, from vertically above or below, without using any member dedicated to sensor detection. This obviates the need for a high-cost sensing technique, thus lowering the cost of the entire apparatus. This also obviates the need to advance/retreat the substrate holder to detect a substrate, thus shortening the tact time of the apparatus.

Other features and advantages of the present invention will be apparent from the following descriptions taken in conjunction with the accompanying drawings, in which like reference characters designate the same or similar parts throughout the figures thereof.

BRIEF DESCRIPTION OF DRAWINGS

The accompanying drawings, which are incorporated in and constitute a part of the specification, illustrate embodiments of the invention and, together with the description, serve to explain the principles of the invention.

DESCRIPTION OF EMBODIMENTS

Exemplary preferred embodiments of the present invention will be described in detail below with reference to the accompanying drawings. However, constituent components described in these embodiments merely provide examples, so the technical scope of the present invention is determined by the scope of claims and is not limited by the following individual embodiments.

Figure 6A:
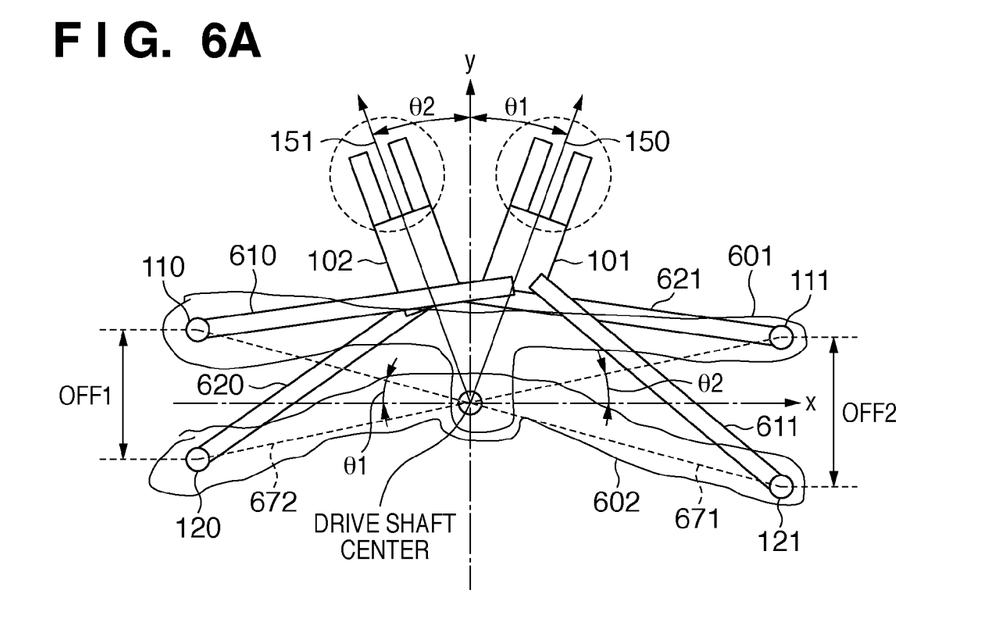
FIG. 6A is a view schematically showing a feature of the substrate transport apparatus according to an embodiment of the present invention.

FIG. 6A is a view schematically showing a feature of a substrate transport apparatus according to an embodiment of the present invention. The substrate transport apparatus includes substrate holders 101 and 102 capable of respectively holding substrates. A first drive arm 601 is coupled to a first drive shaft rotatable about its center. A second drive arm 602 is coupled to a second drive shaft which is coaxial with the first drive shaft, and is rotatable about its center, independently of the first drive shaft (in the following embodiments, the first drive arm 601 will be referred to as a first arm A, and the second drive arm 602 will be referred to as a first arm B).

The first drive arm 601 has a first end portion 110 (first coupling portion) at one end of a link member which forms it, and a second end portion 111 (second coupling portion) at its other end. The second drive arm 602 has a first end portion 120 (fourth coupling portion) at one end of a link member which forms it, and a second end portion 121 (third coupling portion) at its other end. The first end portion 110 (first coupling portion) of the first drive arm 601, and the first end portion 120 (fourth coupling portion) of the second drive arm 602 are spaced apart from each other by a predetermined distance OFF1 in the Y-direction within the plane (within the X-Y plane) in which the substrate holders 101 and 102 move. This predetermined distance will be referred to as a first offset distance hereinafter. Also, the second end portion 111 (second coupling portion) of the first drive arm 601, and the second end portion 121 (third coupling portion) of the second drive arm 602 are spaced apart from each other by a predetermined distance OFF2 in the Y-direction within the plane (within the X-Y plane) in which the substrate holders 101 and 102 move. This predetermined distance will be referred to as a second offset distance hereinafter.

In the substrate transport apparatus according to the embodiment of the present invention, the first drive arm 601 and second drive arm 602 need not have the same shape. If, for example, the shapes of the first drive arm 601 and second drive arm 602 are axisymmetric about the X-axis (first direction axis) and the Y-axis (second direction axis), First Offset Distance OFF1=Second Offset Distance OFF2. The first end portion 110 (first coupling portion) of the first drive arm 601, and the second end portion 121 (third coupling portion) of the second drive arm 602 are point-symmetric about the drive shaft center. Also, the first end portion 120 (fourth coupling portion) of the second drive arm 602, and the second end portion 111 (second coupling portion) of the first drive arm 601 are point-symmetric about the drive shaft center.

Driven arms 610 and 611 are coupled to the substrate holder 101 (first substrate holder) to serve as two first driven arms. Driven arms 620 and 621 are coupled to the substrate holder 102 (second substrate holder) to serve as two second driven arms. In the following embodiments, one driven arm 610 of the two first driven arms will be referred to as a second arm A1, and the other driven arm 611 of the two first driven arms will be referred to as a second arm B1. Also, one driven arm 620 of the two second driven arms will be referred to as a second arm B2, and the other driven arm 621 of the two second driven arms will be referred to as a second arm A2.

One driven arm 610 coupled to the substrate holder 101 is coupled to the first drive arm 601 at the first end portion 110 (first coupling portion) of the first drive arm 601. The other driven arm 611 coupled to the substrate holder 101 is coupled to the second drive arm 602 at the second end portion 121 (third coupling portion) of the second drive arm 602.

One driven arm 620 coupled to the substrate holder 102 is coupled to the second drive arm 602 at the first end portion 120 (fourth coupling portion) of the second drive arm 602. The other driven arm 621 coupled to the substrate holder 102 is coupled to the first drive arm 601 at the second end portion 111 (second coupling portion) of the first drive arm 601. The first end portion 110 (first coupling portion) of the first drive arm 601, and the first end portion 120 (fourth coupling portion) of the second drive arm 602 are spaced apart from each other by the first offset distance OFF1. Also, the second end portion 111 (second coupling portion) of the first drive arm 601, and the second end portion 121 (third coupling portion) of the second drive arm 602 are spaced apart from each other by the second offset distance OFF2.

Let θ1 be the angle that the X-axis makes with a straight line 671 which connects the first end portion 110 (first coupling portion) of the first drive arm 601, and the second end portion 121 (third coupling portion) of the second drive arm 602 to each other. Also, let θ2 be the angle that the X-axis makes with a straight line 672 which connects the first end portion 120 (fourth coupling portion) of the second drive arm 602, and the second end portion 111 (second coupling portion) of the first drive arm 601 to each other. The substrate holders 101 and 102 can advance in the direction in which they separate from the rotation axis of the first drive shaft with movement of the driven arms 610, 611, 620, and 621 which operate as the first drive arm 601 and second drive arm 602 rotate. Also, the substrate holders 101 and 102 can retreat in the direction in which they return to the rotation axis of the first drive shaft with movement of the driven arms 610, 611, 620, and 621 which operate as the first drive arm 601 and second drive arm 602 rotate in the direction opposite to the above case. The advancing operation and the retreating operation will be collectively referred to as an advancing/retreating operation hereinafter. The first end portion 110 (first coupling portion) of the first drive arm 601, and the first end portion 120 (fourth coupling portion) of the second drive arm 602 are spaced apart from each other, and the second end portion 111 (second coupling portion) of the first drive arm 601, and the second end portion 121 (third coupling portion) of the second drive arm 602 are spaced apart from each other, so a track 150 of the advancing/retreating operation of the substrate holder 101 is different from a track 151 of the advancing/retreating operation of the substrate holder 102. Upon defining the rotation axis of the first drive shaft as a reference (center), the track 151 shifts from the track 150 by an angle (θ1+θ2). The substrate holder 101 is within a first plane perpendicular to the rotation axis of the first drive shaft, while the substrate holder 102 is within a second plane perpendicular to the rotation axis of the first drive shaft. The second plane is parallel to the first plane, and is different from the position of the first plane in the direction of gravity.

First Embodiment (Functional Configuration of Substrate Transport Apparatus)

Figure 5:
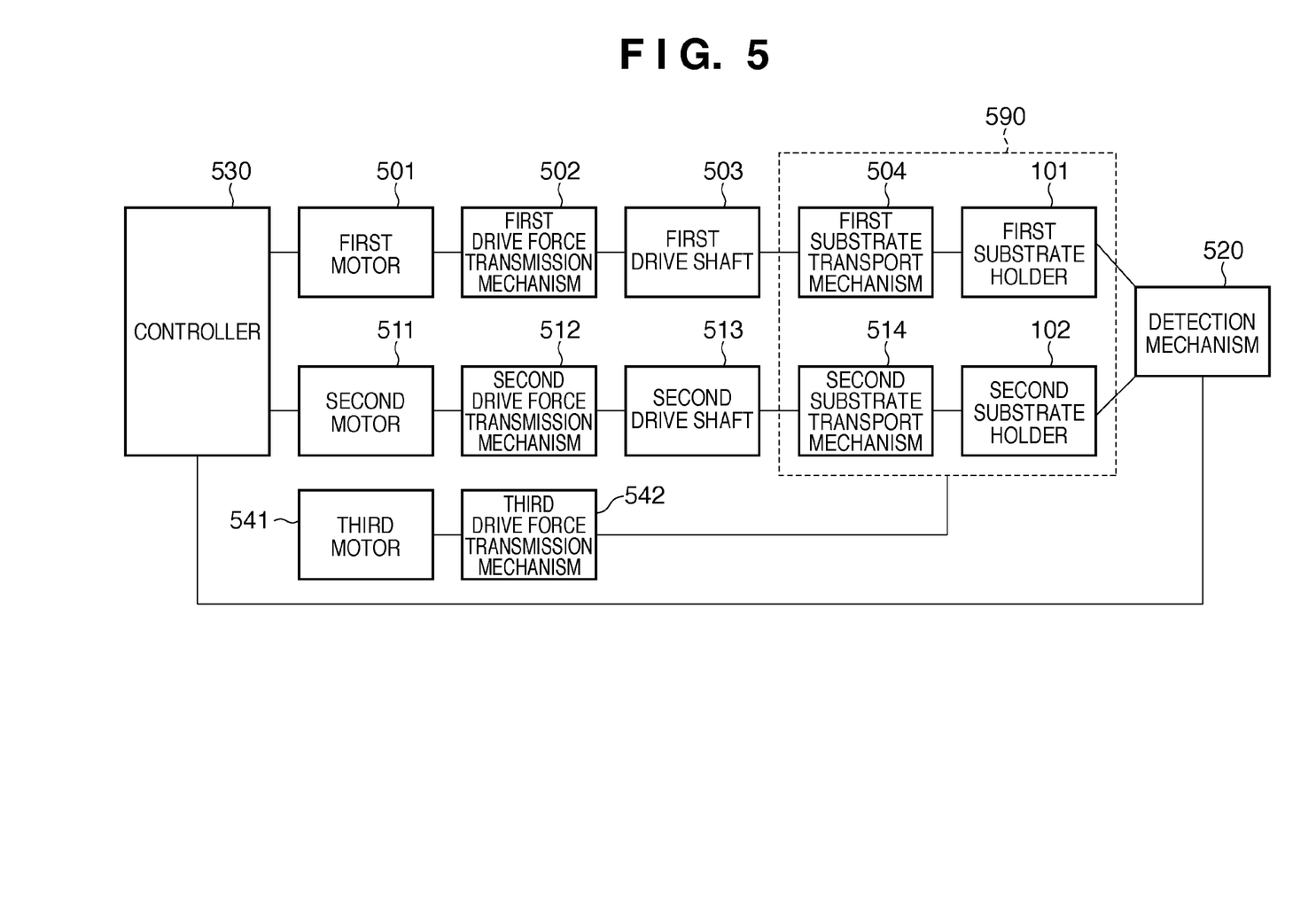
FIG. 5 is a block diagram for explaining the functional configuration of a substrate transport apparatus according to an embodiment of the present invention.

The functional configuration of a substrate transport apparatus according to an embodiment of the present invention will be described with reference to FIG. 5. The substrate transport apparatus includes two substrate holders (substrate holders 101 and 102) on which substrates W can be mounted. The substrate holder 101 is connected to a first substrate transport mechanism 504 formed by coupling a plurality of links (to be referred to as "arms" hereinafter), and is movable on a predetermined track upon the operation of the first substrate transport mechanism 504. The rotary drive force of a first motor 501 disposed outside a vacuum chamber is transmitted to the first substrate transport mechanism 504 via a first drive force transmission mechanism 502 and a first drive shaft 503.

Similarly, the substrate holder 102 is connected to a second substrate transport mechanism 514 formed by coupling a plurality of arms, and is movable on a predetermined track upon the operation of the second substrate transport mechanism 514. The rotary drive force of a second motor 511 disposed outside the vacuum chamber is transmitted to the second substrate transport mechanism 514 via a second drive force transmission mechanism 512 and a second drive shaft 513.

The first drive shaft 503 has a columnar shape, while the second drive shaft 513 has a hollow cylindrical shape. The first drive shaft 503 is placed in the second drive shaft 513 to make the first drive shaft 503 and second drive shaft 513 coaxial with each other.

A detection mechanism 520 is placed vertically above or below the substrate holders 101 and 102, and detects the substrate holders 101 and 102. The detection mechanism 520 can detect whether substrates are held on both the substrate holders 101 and 102, or a substrate is held on at least one of them. The detection result obtained by the detection mechanism 520 is transmitted to a controller 530. The controller 530 controls the operation of the overall substrate transport apparatus based on detection information obtained by the encoder of the first motor 501, detection information obtained by the encoder of the second motor 511, and the detection result obtained by the detection mechanism 520. The detection information obtained by the encoder of the first motor 501 includes the information of the rotation angle and rotation speed of the first motor 501. Also, the detection information obtained by the encoder of the second motor 511 includes the information of the rotation angle and rotation speed of the second motor 511. The controller 530 can calculate the rotation angle and rotation speed of the first drive shaft 503, based on the information of the rotation angle and rotation speed of the first motor 501. Also, the controller 530 can calculate the rotation angle and rotation speed of the second drive shaft 513, based on the information of the rotation angle and rotation speed of the second motor 511. These pieces of information are fed back to the control of the substrate transport apparatus.

The controller 530 can rotate an entire robot arm mechanism 590 by controlling the first motor 501 and second motor 511 in synchronism with each other so that the first drive shaft 503 and second drive shaft 513 rotate in the same direction in synchronism with each other. The controller 530 rotates and positions the entire robot arm mechanism 590 at a predetermined position relative to the substrate holding position of a process apparatus to or from which a substrate is supplied or recovered. The entire robot arm mechanism 590 includes, for example, the substrate holders 101 and 102 and first and second substrate transport mechanisms 504 and 514. The rotary drive force of a third motor 541 disposed outside the vacuum chamber is transmitted to a third drive force transmission mechanism 542 to lift or lower the entire robot arm mechanism 590 in the Z-direction. The controller 530 controls the third motor 541 to control positioning of the substrate holders 101 and 102 in the Z-direction relative to the substrate holding position of a process apparatus to or from which a substrate is supplied or recovered.

Figure 6B:
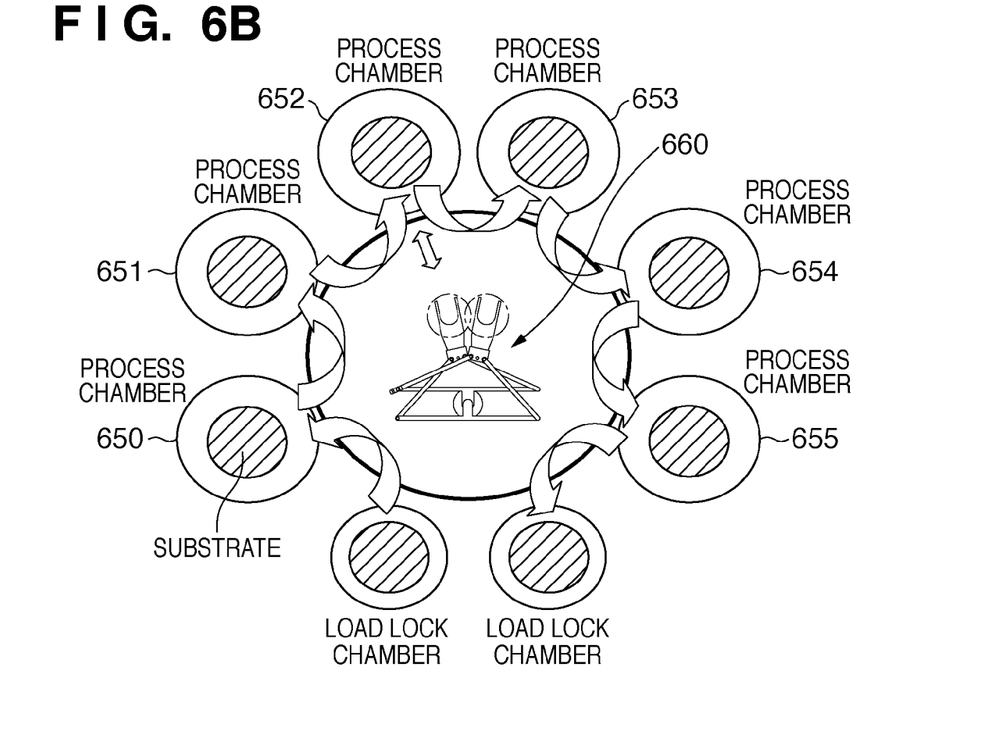
FIG. 6B is a view for explaining the arrangement of a system for manufacturing an electronic device according to an embodiment of the present invention.

The rotation operation of the entire robot arm mechanism 590 is called a revolution operation. With the revolution operation of the entire robot arm mechanism 590, and the extending and retracting operations of the first and second substrate transport mechanisms 504 and 514, the substrate transport apparatus can supply a substrate to a process apparatus, or recover a processed substrate from the process apparatus (FIG. 6B).

(Substrate Transport Mechanism)

Figure 1A:
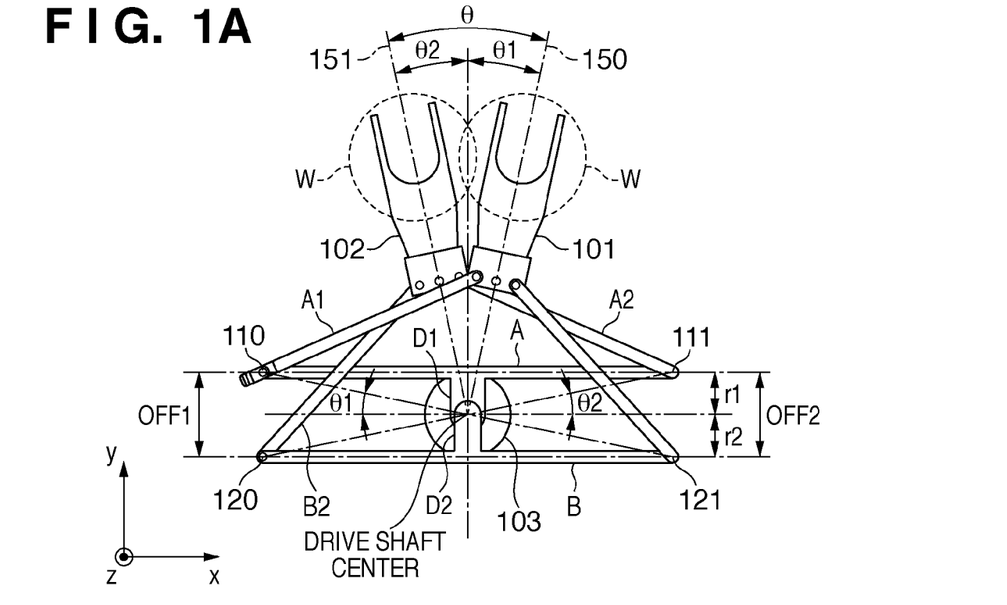
FIG. 1A is a view for explaining first and second substrate transport mechanisms according to the first embodiment.

The arrangements of the first substrate transport mechanism 504 and second substrate transport mechanism 514 according to the first embodiment will be described below with reference to FIGS. 1A and 1B. FIG. 1A shows the arrangements of the first substrate transport mechanism 504 and second substrate transport mechanism 514 during revolution of the entire robot arm mechanism 590 within the X-Y plane. The axial direction of the first drive shaft 503 and second drive shaft 513 corresponds to the Z-direction perpendicular to the paper surface of FIG. 1A, and the first drive shaft 503 and second drive shaft 513 rotate about the drive shaft center (rotation center).

The first substrate transport mechanism 504 according to this embodiment includes the first arm A and second arms A1 and B1. Also, the second substrate transport mechanism 514 according to this embodiment includes the first arm B and second arms B2 and A2. The first arm A is rotatably coupled to the first drive shaft 503 via a member D1. The rotation of the first drive shaft 503 is transmitted to the first arm A via the member D1. With the rotation of the first drive shaft 503, the first arm A can pivot in the X-Y plane. The first arm B is rotatably coupled to the second drive shaft 513 via a member D2. The rotation of the second drive shaft 513 is transmitted to the first arm B via the member D2. With the rotation of the second drive shaft 513, the first arm B can pivot in the X-Y plane as well.

The first end portion 110 (first coupling portion) of the first arm A, and the first end portion 120 (fourth coupling portion) of the first arm B are spaced apart from each other by a predetermined distance OFF1 in the Y-direction within the plane (within the X-Y plane) in which the substrate holders 101 and 102 move. Also, the second end portion 111 (second coupling portion) of the first arm A, and the second end portion 121 (third coupling portion) of the first arm B are spaced apart from each other by a predetermined distance OFF2 in the Y-direction within the plane (within the X-Y plane) in which the substrate holders 101 and 102 move.

If, for example, the shapes of the first arms A and B are axisymmetric about the X-axis (first direction axis) and the Y-axis (second direction axis), First Offset Distance OFF1=Second Offset Distance OFF2. The first end portion 110 (first coupling portion) of the first arm A, and the second end portion 121 (third coupling portion) of the first arm B are point-symmetric about the drive shaft center. Also, the first end portion 120 (fourth coupling portion) of the first arm B, and the second end portion 111 (second coupling portion) of the first arm A are point-symmetric about the drive shaft center.

A first direction axis defined by a straight line which connects the first end portion 110 (first coupling portion) and second end portion 111 (second coupling portion) of the first arm A to each other is spaced apart by a first distance r1 from the rotation axis (drive shaft center) of the first drive shaft to which the first arm A is rotatably coupled. Also, a second direction axis defined by a straight line which connects the second end portion 121 (third coupling portion) and first end portion 120 (fourth coupling portion) of the first arm B to each other is spaced apart from the rotation axis (drive shaft center) of the second drive shaft by a second distance r2. Note that the second drive shaft is an axis which is coaxial with the first drive shaft, and to which the first arm B is rotatably coupled, independently of the first drive shaft.

A state shown in FIG. 1A exemplifies the case wherein the first arms A and B are formed by members with the same shape. In this case, the first offset distance OFF1 is equal to the second offset distance OFF2. Also, the two distances with reference to the drive shaft center satisfy a relation: First Distance r1=Second Distance r2. Note that the shapes of the members which form the first arms A and B are not limited to the same shape, and the present invention is applicable to members with different shapes. Also, the two distances with reference to the drive shaft center may satisfy a relation: First Distance r1>Second Distance r2, or First Distance r1<Second distance r2.

The substrate holder 101 is coupled to one end of each of the second arms A1 and B1. Also, the substrate holder 102 is coupled to one end of each of the second arms B2 and A2. The other end of the second arm A1 is rotatably coupled to one end (first end portion) 110 of the first arm A serving as a link member, while the other end of the second arm A2 is rotatably coupled to the other end (second end portion) 111 of the first arm A. The other end of the second arm B2 is rotatably coupled to one end (first end portion) 120 of the first arm B, while the other end of the second arm B1 is rotatably coupled to the other end (second end portion) 121 of the first arm B.

Figure 1B:
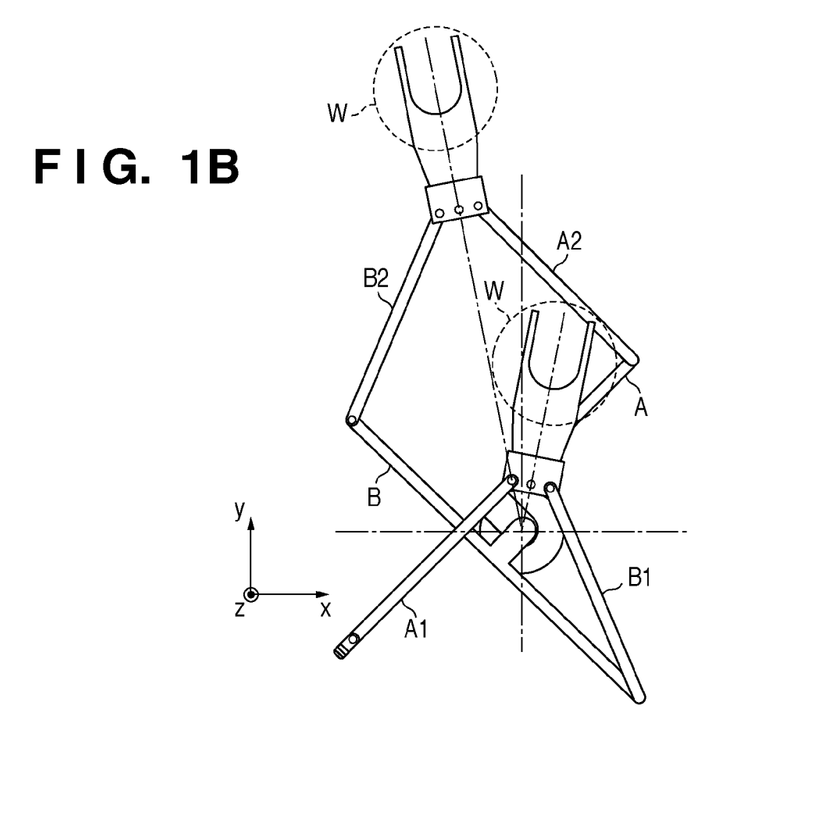
FIG. 1B is a view for explaining the first and second substrate transport mechanisms according to the first embodiment.

Referring to FIGS. 1A and 1B, the substrate holder 101 is at a retreated position while the first arm A and second arms A1 and B2 are in a retracted state. The substrate holder 102 is at a retreated position while the first arm B and second arms B2 and A2 are in a retracted state. The substrate holders 101 and 102 at the retreated positions shift from each other by an angle θ=θ1+θ2 without overlap in the rotation axis direction of the first drive shaft perpendicular to the X-Y plane. That is, the track 150 of the substrate holder 101 as it moves in the X-Y plane (in the first plane), and the track 151 of as the substrate holder 102 as it moves in the X-Y plane (in the second plane) shift from each other by an angle θ=θ1+θ2. When the detection mechanism 520 captures images of the substrate holders 101 and 102 from the Z-direction (from vertically above or below), it can detect the substrate holders 101 and 102 without overlap. Based on the detection result obtained by the detection mechanism 520, the controller 530 can determine whether a substrate W is held on at least one of the substrate holders 101 and 102.

FIG. 1B shows the first arm B and second arms B2 and A2 which constitute the second substrate transport mechanism 514 in an extended state. In this extended state, a substrate W can be supplied from the substrate holder 102 to a predetermined process apparatus. Alternatively, a substrate W processed by a predetermined process apparatus can be recovered from this process apparatus to the substrate holder 102.

Figure 2A:
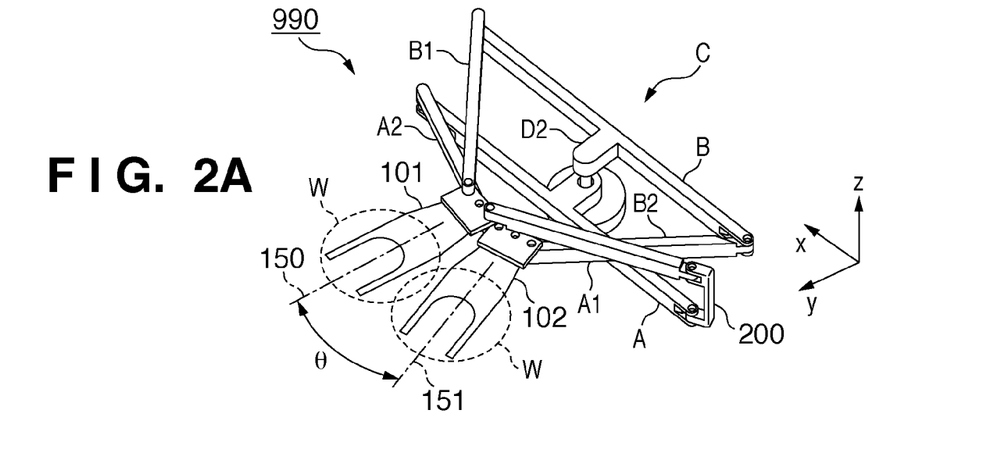
FIG. 2A is a view for explaining the operations of the first and second substrate transport mechanisms according to the first embodiment.

FIG. 2A is a bird's eye view of the entire robot arm mechanism 590 in a retracted state. The first arm A and second arm A1 which constitute the first substrate transport mechanism 504 are rotatably coupled to each other via a coupling member 200. The mediacy of the coupling member 200 allows the formation of a space between the first arm A and the second arm A1 in the Z-direction so that the second arm B2 can be interposed between the first arm A and the second arm A1. This makes it possible to accommodate the first substrate transport mechanism 504 (first arm A and second arms A1 and B2) and second substrate transport mechanism 514 (first arm B and second arms B2 and A2) in a small three-dimensional space.

Figure 2B:
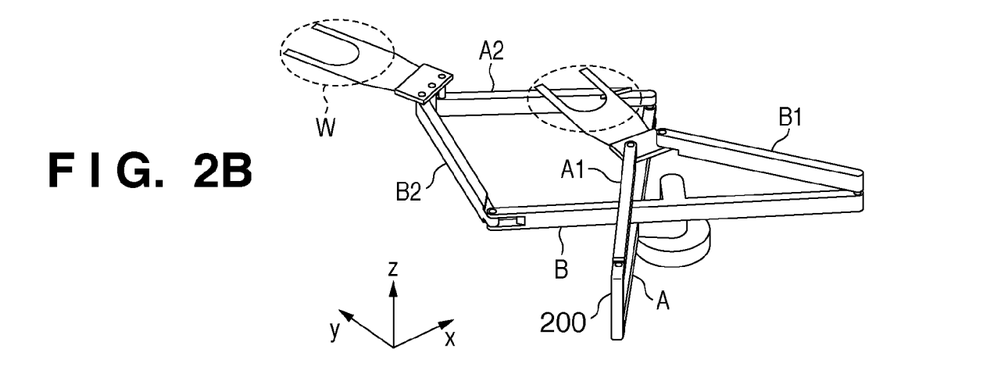
FIG. 2B is a view for explaining the operations of the first and second substrate transport mechanisms according to the first embodiment.

FIG. 2B is a bird's eye view of the first arm B and second arms B2 and A2 which constitute the second substrate transport mechanism 514 in an extended state. To set an extended state as shown in FIG. 2B, the controller 530 controls the first motor 501 to rotate the first drive shaft 503 counterclockwise (CCW). By an operation synchronized with this operation, the controller 530 controls the second motor 511 to rotate the second drive shaft 513 clockwise (CW). With this synchronization operation, the first arm A rotates in the CCW direction, while the first arm B rotates in the CW direction.

The second arm A2 coupled to the first arm A, the second arm B2 coupled to the first arm B, and the substrate holder 102 constitute a link mechanism. Hence, the substrate holder 102 interlocks with the operations of the first arms A and B and advances within the X-Y plane, so the first arm B and second arms B2 and A2 which constitute the second substrate transport mechanism 514 are set in an extended state. When the substrate holder 102 is to be returned to the original position, the controller 530 controls the first motor 501 and second motor 511 in synchronism with each other to rotate them in the directions opposite to the case wherein they are rotated to set the first arm B and second arms B2 and A2 in an extended state.

Figure 2C:
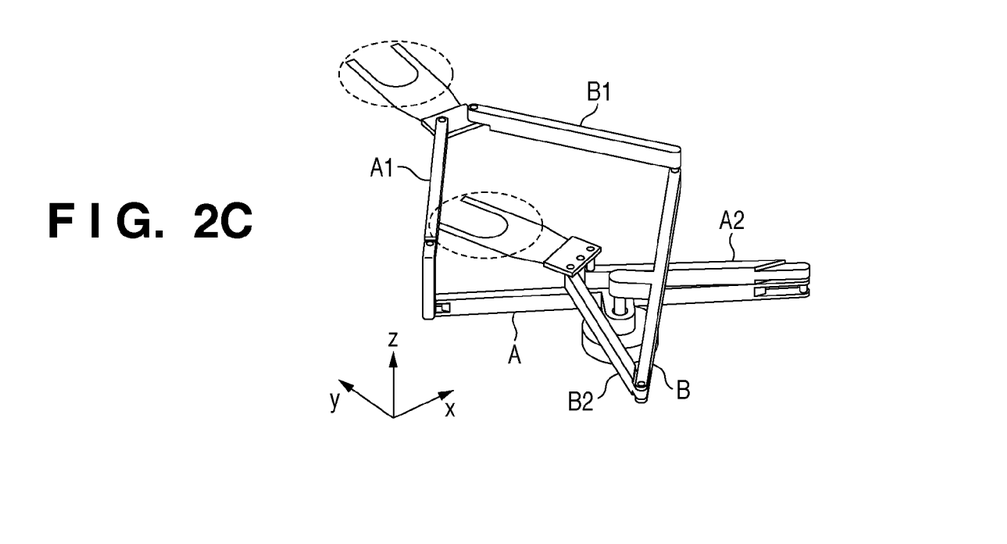
FIG. 2C is a view for explaining the operations of the first and second substrate transport mechanisms according to the first embodiment.

FIG. 2C is a bird's eye view of the first arm A and second arms A1 and B1 which constitute the first substrate transport mechanism 504 in an extended state. For example, a substrate which is supplied to a predetermined process apparatus by the substrate holder 102, described with reference to FIG. 2B, and is processed by this process apparatus can be recovered from this process apparatus by the operation of the first substrate transport mechanism 504 shown in FIG. 2C. To set an extended state as shown in FIG. 2C, the controller 530 controls the first motor 501 to rotate the first drive shaft 503 clockwise (CW). By a synchronized operation with this operation, the controller 530 controls the second motor 511 to rotate the second drive shaft 513 counterclockwise (CCW). With this synchronization operation, the first arm A rotates in the CW direction, while the first arm B rotates in the CCW direction.

The second arm A1 coupled to the first arm A, the second arm B1 coupled to the first arm B, and the substrate holder 101 constitute a link mechanism. Hence, the substrate holder 101 interlocks with the operations of the first arms A and B and advances within the X-Y plane, so the first arm A and second arms A1 and B1 which constitute the first substrate transport mechanism 504 are set in an extended state. When the substrate holder 101 is to be returned to the original position, the controller 530 controls the first motor 501 and second motor 511 in synchronism with each other to rotate them in the directions opposite to the case wherein they are rotated to set the first arm A and second arms A1 and B1 in an extended state.

The controller 530 can also rotate (revolve) the entire robot arm mechanism 590 by controlling the first motor 501 and second motor 511 so that the first drive shaft 503 and second drive shaft 513 rotate in the same direction in synchronism with each other.

(Operation of Substrate Transport Apparatus)

The controller 530 controls the extending operation for setting an extended state, the retracting operation for setting a retracted state, and the revolution operation, described earlier, as the operation of the substrate transport apparatus. As a practical example, assuming that no substrate is mounted on the substrate holder 102 while an unprocessed substrate is mounted on the substrate holder 101, the revolution operation and the substrate exchange (supply and recovery) operation for the process apparatus will be described hereinafter. Note that the process apparatus has executed a predetermined process for the already supplied substrate.

(1) After completion of the predetermined process, the controller 530 revolves the entire robot arm mechanism 590 to a position which matches the direction (track 151), in which the substrate holder 102 advances, with the center of the substrate in the process chamber of the process apparatus. At this time, the controller 530 concurrently performs an operation of moving the position of the substrate holder 102 in the height direction (Z-direction) to that lower than the level of the substrate in the process chamber of the process apparatus.

(2) The controller 530 then sets the second substrate transport mechanism 514 (first arm B and second arms B2 and A2) in an extended state to advance the substrate holder 102. When the advancing operation of the substrate holder 102 is complete, the substrate holding surface of the substrate holder 102 is positioned below the lower surface of the substrate.

(3) The controller 530 lifts the substrate holder 102 so that the position of the substrate holder 102 in the height direction (Z-direction) becomes higher than the substrate holding position of the process chamber to transfer the processed substrate onto the substrate holding surface of the substrate holder 102.

(4) The controller 530 then sets the second substrate transport mechanism 514 (first arm B and second arms B2 and A2) in a retracted state to retreat the substrate holder 102. Upon this operation, the recovery of the processed substrate from the process chamber of the process apparatus is completed.

(5) Next, the controller 530 revolves the entire robot arm mechanism 590 to a position which matches the direction (track 150), in which the substrate holder 101 advances, with the center of the substrate in the process chamber of the process apparatus. At this time, the controller 530 concurrently performs an operation of moving the position of the substrate holder 101 in the height direction (Z-direction) to that lower than the level of the substrate in the process chamber of the process apparatus.

(6) The controller 530 then sets the first substrate transport mechanism 504 (first arm A and second arms A1 and B2) in an extended state to advance the substrate holder 101. When the advancing operation of the substrate holder 101 is complete, the substrate holding surface of the substrate holder 101 is positioned above the substrate holding position of the process chamber.

(7) The controller 530 lowers the substrate holder 101 so that the position of the substrate holder 101 in the height direction (Z-direction) becomes lower than the substrate holding position of the process chamber to transfer the substrate held on the substrate holder 101 to the substrate holding position of the process chamber. In this state, an unprocessed substrate that has been present on the substrate holder 101 is set at the substrate holding position of the process chamber.

(8) The controller 530 then sets the first substrate transport mechanism 504 (first arm A and second arms A1 and B2) in a retracted state to retreat the substrate holder 101. Upon this operation, the supply of an unprocessed substrate to the substrate holding position of the process chamber of the process apparatus is completed.

By executing the above-mentioned operations (1) to (8) for each process apparatus, the substrate transport apparatus can supply a substrate to each of a plurality of radially arranged process apparatuses (FIG. 6B). Alternatively, the substrate transport apparatus can recover a processed substrate from each process apparatus.

According to this embodiment, it is possible to efficiently detect whether a substrate is held on each of a plurality of substrate holders. More specifically, according to the present invention, it is possible to detect whether a substrate is held on each of a plurality of substrate holders, from vertically above or below, without using any member dedicated to sensor detection. This obviates the need for a high-cost sensing technique, thus lowering the cost of the entire apparatus. This also obviates the need to advance/retreat the substrate holder to detect a substrate, thus shortening the tact time of the apparatus.

Second Embodiment

Figure 3A:
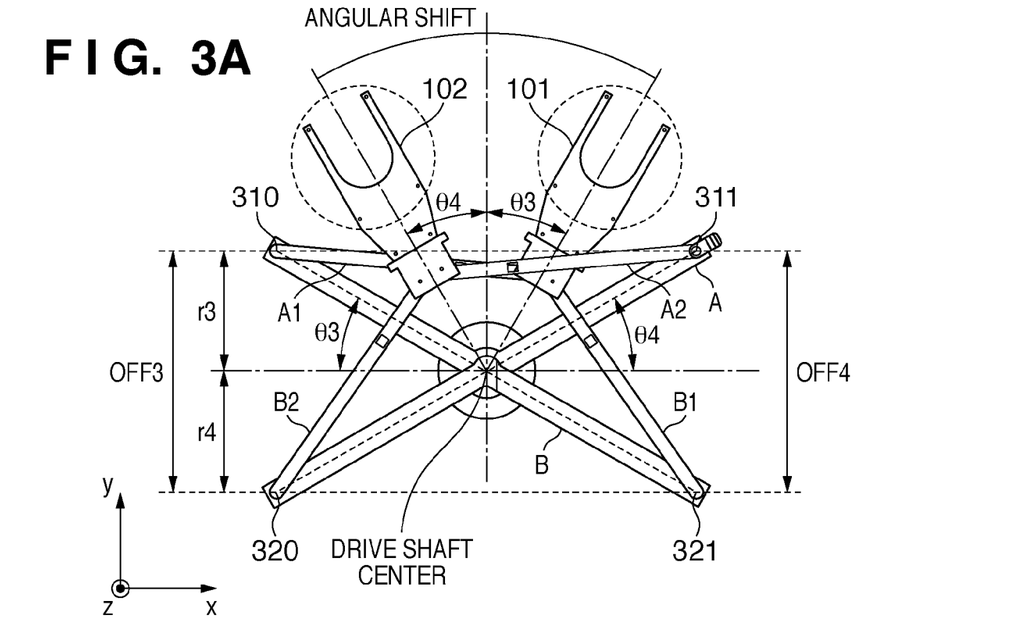
FIG. 3A is a view for explaining first and second substrate transport mechanisms according to the second embodiment.

The arrangements of a first substrate transport mechanism 504 and second substrate transport mechanism 514 according to the second embodiment will be described below with reference to FIGS. 3A and 3B. FIG. 3A shows the arrangements of the first substrate transport mechanism 504 and second substrate transport mechanism 514 during revolution of an entire robot arm mechanism 590 within the X-Y plane. The axial direction of a first drive shaft 503 and second drive shaft 513 corresponds to the Z-direction perpendicular to the paper surface of FIG. 3A, and the first drive shaft 503 and second drive shaft 513 rotate about the drive shaft center (rotation center), as in the first embodiment.

In the second embodiment, the first substrate transport mechanism 504 includes a first arm A and second arms A1 and B1. Also, the second substrate transport mechanism 514 according to this embodiment includes the first arm B and second arms B2 and A2. The members which form the first arms A and B are different from the first and second embodiments in that the first arms A and B in the second embodiment are formed by V-shaped members, while those described in the first embodiment are formed by linear members.

Figure 3B:
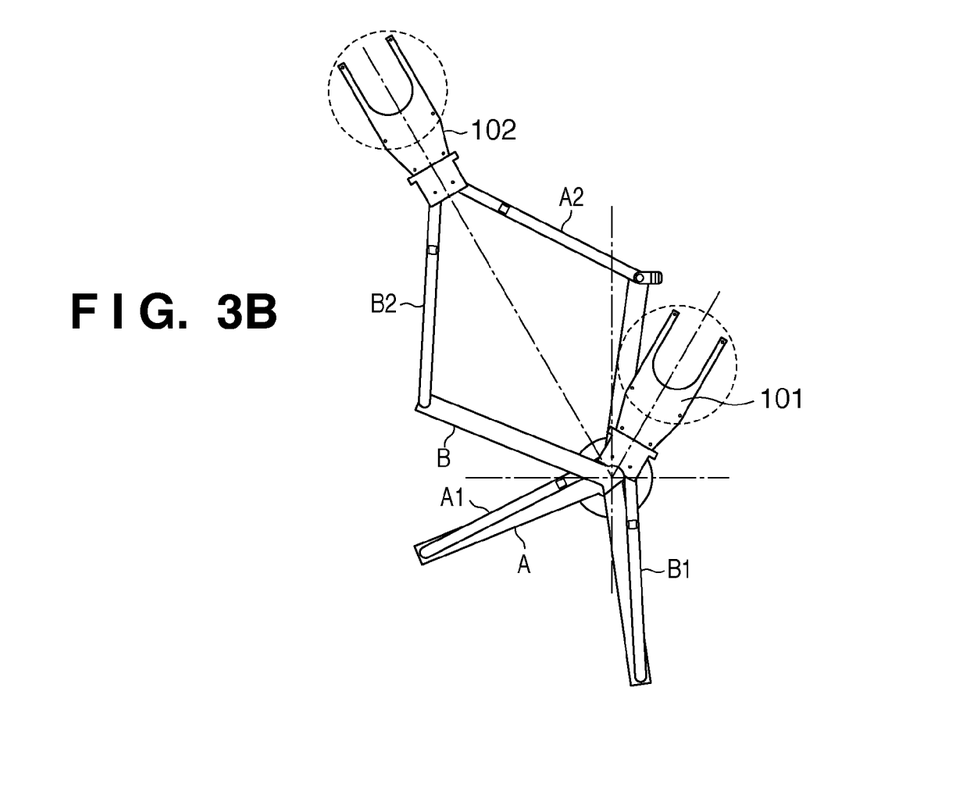
FIG. 3B is a view for explaining the first and second substrate transport mechanisms according to the second embodiment.

In the arrangement example shown in FIGS. 3A and 3B, the first arms A and B have the same arm length, and are axisymmetric about center lines which pass through the drive shaft center (rotation center) and run in the direction of the X-axis (first direction axis) and that of the Y-axis (second direction axis), for the sake of simplicity.

The first arm A which functions as a first drive arm is coupled to the first drive shaft 503, and can pivot in the X-Y plane with the rotation of the first drive shaft 503. The first arm B which functions as a second drive arm is coupled to the second drive shaft 513, and can pivot in the X-Y plane with the rotation of the second drive shaft 513.

A first end portion 310 (first coupling portion) of the first arm A, and a first end portion 320 (fourth coupling portion) of the first arm B are spaced apart from each other by a first offset distance OFF3 in the Y-direction within the plane (within the X-Y plane) in which substrate holders 101 and 102 move. Also, a second end portion 311 (second coupling portion) of the first arm A, and a second end portion 321 (third coupling portion) of the first arm B are spaced apart from each other by a second offset distance OFF4 in the Y-direction within the plane (within the X-Y plane) in which the substrate holders 101 and 102 move.

If, for example, the shapes of the first arms A and B are axisymmetric about the X-axis (first direction axis) and the Y-axis (second direction axis), First Offset Distance OFF3=Second Offset Distance OFF4. The first end portion 310 (first coupling portion) of the first arm A, and the second end portion 321 (third coupling portion) of the first arm B are point-symmetric about the drive shaft center. Also, the first end portion 320 (fourth coupling portion) of the first arm B, and the second end portion 311 (second coupling portion) of the first arm A are point-symmetric about the drive shaft center.

A first direction axis defined by a straight line which connects the first end portion 310 (first coupling portion) and second end portion 311 (second coupling portion) of the first arm A to each other is spaced apart by a first distance r3 from the rotation axis (drive shaft center) of the first drive shaft to which the first arm A is rotatably coupled. Also, a second direction axis defined by a straight line which connects the second end portion 321 (third coupling portion) and first end portion 320 (fourth coupling portion) of the first arm B to each other is spaced apart from the rotation axis (drive shaft center) of the second drive shaft by a second distance r4. Note that the second drive shaft is an axis which is coaxial with the first drive shaft, and to which the first arm B is rotatably coupled, independently of the first drive shaft.

FIG. 3A exemplifies the case wherein the first arms A and B are formed by members with the same V shape. In this case, the first offset distance OFF3 is equal to the second offset distance OFF4. Also, the two distances with reference to the drive shaft center satisfy a relation: First Distance r3=Second Distance r4. Note that the shapes of the members which form the first arms A and B are not limited to the same shape, and the present invention is applicable to members with different shapes. Also, the two distances with reference to the drive shaft center may satisfy a relation: First Distance r3>Second Distance r4, or First Distance r3<Second distance r4.

The substrate holder 101 is coupled to one end of each of the second arms A1 and B1, which function as two first driven arms. Also, the substrate holder 102 is coupled to one end of each of the second arms B2 and A2, which function as two second driven arms. The other end of the second arm A1 is rotatably coupled to one end (first end portion) 310 of the first arm A, while the other end of the second arm A2 is rotatably coupled to the other end (second end portion) 311 of the first arm A. The other end of the second arm B2 is rotatably coupled to one end (first end portion) 320 of the first arm B, while the other end of the second arm B1 is rotatably coupled to the other end (second end portion) 321 of the first arm B.

Let θ3 be the angle that the X-axis makes with a straight line which connects the first end portion 310 of the first arm A, and the second end portion 321 of the first arm B to each other. Also, let θ4 be the angle that the X-axis makes with a straight line which connects the first end portion 320 of the first arm B, and the second end portion 311 of the first arm A to each other.

As the first end portion 310 of the first arm A, and the first end portion 320 of the first arm B are spaced apart from each other, and the second end portion 311 of the first arm A, and the second end portion 321 of the first arm B are spaced apart from each other, the track of the advancing/retreating operation of the substrate holder 101 is different from that of the advancing/retreating operation of the substrate holder 102. That is, the track of the advancing/retreating operation of the substrate holder 102 shifts from that of the advancing/retreating operation of the substrate holder 101 by an angle (θ3+θ4). The substrate holders 101 and 102 do not overlap on each other in the rotation axis direction of the first drive shaft perpendicular to the X-Y plane. Hence, when the detection mechanism 520 detects the states of the substrate holders 101 and 102 from the Z-direction (from vertically above or below), the controller 530 can determine, based on the detection result obtained by the detection mechanism 520, whether a substrate W is held on each of the substrate holders 101 and 102.

FIG. 3B shows the first arm B and second arms B2 and A2 which constitute the second substrate transport mechanism 514 in an extended state. In this extended state, a substrate W can be supplied from the substrate holder 102 to a predetermined process apparatus. Alternatively, a substrate W processed by a predetermined process apparatus can be recovered from this process apparatus to the substrate holder 102.

Figure 4A:
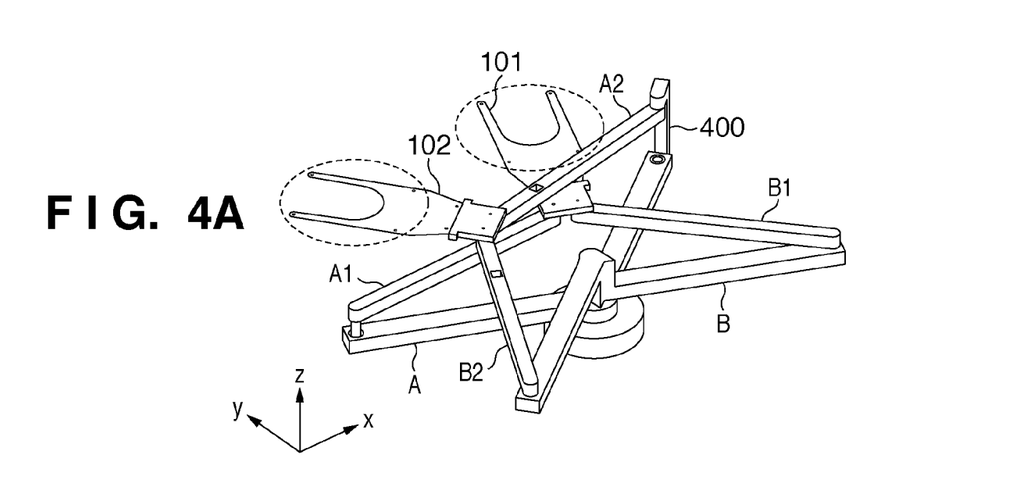
FIG. 4A is a view for explaining the operations of the first and second substrate transport mechanisms according to the second embodiment.

FIG. 4A is a bird's eye view of the entire robot arm mechanism 590 in a retracted state. The first arm A and second arm A2 which constitute the second substrate transport mechanism 514 are rotatably coupled to each other via a coupling member 400. The mediacy of the coupling member 400 allows the formation of a space between the first arm A and the second arm A2 in the Z-direction so that the second arm B1 can be interposed between the first arm A and the second arm A2.

Figure 4B:
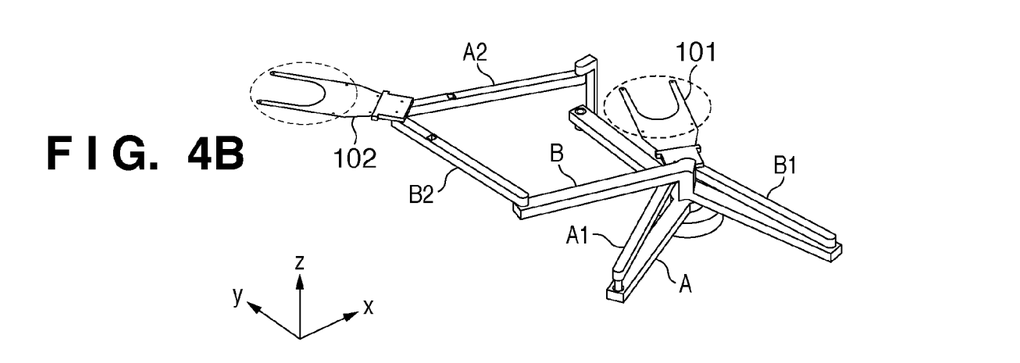
FIG. 4B is a view for explaining the operations of the first and second substrate transport mechanisms according to the second embodiment.

FIG. 4B is a bird's eye view of the first arm B and second arms B2 and A2 which constitute the second substrate transport mechanism 514 in an extended state. To set an extended state as shown in FIG. 4B, the controller 530 controls the first motor 501 to rotate the first drive shaft 503 counterclockwise (CCW). By a synchronized operation with this operation, the controller 530 controls the second motor 511 to rotate the second drive shaft 513 clockwise (CW). With this synchronization operation, the first arm A rotates in the CCW direction, while the first arm B rotates in the CW direction.

The second arm A2 coupled to the first arm A, the second arm B2 coupled to the first arm B, and the substrate holder 102 constitute a link mechanism. Hence, the substrate holder 102 interlocks with the operations of the first arms A and B and advances within the X-Y plane, so the first arm B and second arms B2 and A2 which constitute the second substrate transport mechanism 514 are set in an extended state. When the substrate holder 102 is to be returned to the original position, the controller 530 controls the first motor 501 and second motor 511 in synchronism with each other to rotate them in the directions opposite to the case wherein they are rotated to set the first arm B and second arms B2 and A2 in an extended state.

Figure 4C:
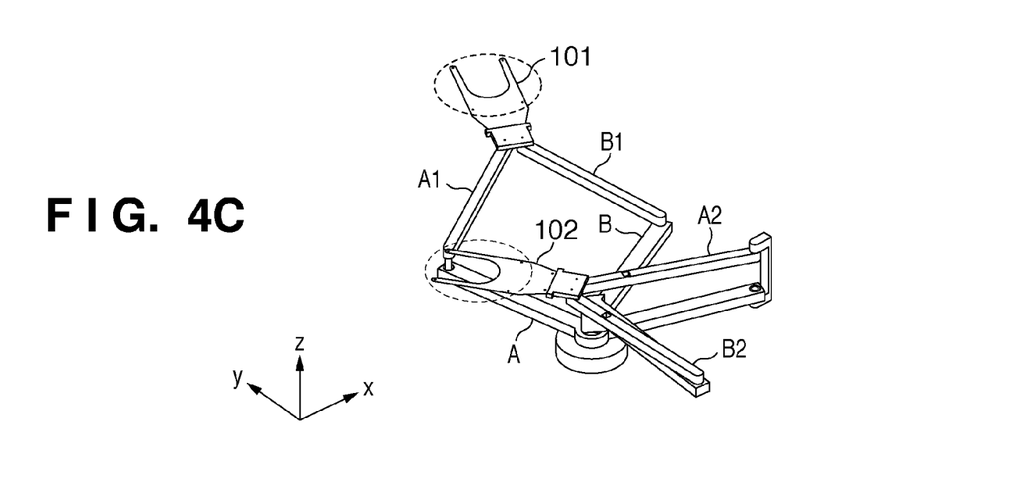
FIG. 4C is a view for explaining the operations of the first and second substrate transport mechanisms according to the second embodiment.

FIG. 4C is a bird's eye view of the first arm A and second arms A1 and B1 which constitute the first substrate transport mechanism 504 in an extended state. For example, a substrate which is supplied to a predetermined process apparatus by the substrate holder 102, described with reference to FIG. 4B, and is processed by this process apparatus can be recovered from this process apparatus by the operation of the first substrate transport mechanism 504 shown in FIG. 4C.

To set an extended state as shown in FIG. 4C, the controller 530 controls the first motor 501 to rotate the first drive shaft 503 clockwise (CW). By an operation synchronized with this operation, the controller 530 controls the second motor 511 to rotate the second drive shaft 513 counterclockwise (CCW). With this synchronization operation, the first arm A rotates in the CW direction, while the first arm B rotates in the CCW direction.

The second arm A1 coupled to the first arm A, the second arm B1 coupled to the first arm B, and the substrate holder 101 constitute a link mechanism. Hence, the substrate holder 101 interlocks with the operations of the first arms A and B and advances within the X-Y plane, so the first arm A and second arms A1 and B1 which constitute the first substrate transport mechanism 504 are set in an extended state. When the substrate holder 101 is to be returned to the original position, the controller 530 controls the first motor 501 and second motor 511 in synchronism with each other to rotate them in the directions opposite to the case wherein they are rotated to set the first arm A and second arms A1 and B1 in an extended state.

The controller 530 can also rotate (revolve) the entire robot arm mechanism 590 by controlling the first motor 501 and second motor 511 so that the first drive shaft 503 and second drive shaft 513 rotate in the same direction in synchronism with each other.

By executing operations (1) to (8), mentioned in the first embodiment, for each process apparatus, the substrate transport apparatus can supply a substrate to each of a plurality of radially arranged process apparatuses (FIG. 6B). Alternatively, the substrate transport apparatus can recover a processed substrate from each process apparatus.

According to this embodiment, it is possible to efficiently detect whether a substrate is held on each of a plurality of substrate holders. More specifically, according to the present invention, it is possible to detect whether a substrate is held on each of a plurality of substrate holders, from vertically above or below, without using any member dedicated to sensor detection. This obviates the need for a high-cost sensing technique, thus lowering the cost of the entire apparatus. This also obviates the need to advance/retreat the substrate holder to detect a substrate, thus shortening the tact time of the apparatus.

(System and Method for Manufacturing Electronic Device)

An embodiment of a system for manufacturing an electronic device will be described with reference to FIG. 6B. Load lock chambers LL1 and LL2 for loading and unloading substrates to be processed in the system for manufacturing an electronic device, and process apparatuses 650 to 655 which perform various processes for the substrates are arranged around a substrate transport apparatus 660 as a center. By radially arranging a plurality of process apparatuses 650 to 655 around one substrate transport apparatus 660, the substrate transport apparatus 660 can transport substrates to the process apparatuses 650 to 655 at once. The system for manufacturing an electronic device according to this embodiment includes a substrate transport apparatus as explained in the above-mentioned embodiments, and at least one process apparatus which executes a device manufacturing process for a substrate transported by the substrate transport apparatus.

Also, a method of manufacturing an electronic device includes a transport step of transporting a substrate using a substrate transport apparatus, and a process execution step of executing a device manufacturing process for the substrate, transported in the transport step, in at least one process apparatus. Electronic devices manufactured by a system and method for manufacturing an electronic device include at least one of, for example, a semiconductor, an LCD, a solar battery, and an optical communication device.

According to this embodiment, it is possible to lower the cost of the entire system for manufacturing an electronic device. Also, since there is no need to advance/retreat the substrate holders in the substrate transport apparatus to detect substrates, it is possible to shorten the tact time of the system for manufacturing an electronic device.

The present invention is not limited to the above-described embodiments, and various changes and modifications can be made within the spirit and scope of the present invention. Therefore, to apprise the public of the scope of the present invention, the following claims are made.

The invention claimed is:

1. A substrate transport apparatus comprising:
    a first substrate holder and a second substrate holder capable of respectively holding substrates;
    a first pair of driven arms comprising a first driven arm and a second driven arm, each of which has a first end, which is coupled to said first substrate holder, and a second end;
    a second pair of driven arms comprising a third driven arm and a fourth driven arm, each of which has a first end, which is coupled to said second substrate holder, and a second end;
    a first drive arm including, at a first end, a first coupling portion which is coupled to the second end of said first driven arm, and at a second end, a second coupling portion which is coupled to the second end of said fourth driven arm;
    a second drive arm including, at a first end, a third coupling portion which is coupled to the second end of said second driven arm, and at a second end, a fourth coupling portion which is coupled to the second end of said third driven arm;
    a first drive shaft to which said first drive arm is rotatably coupled; and
    a second drive shaft which is coaxial with said first drive shaft, and to which said second drive arm is rotatably coupled, independently of said first drive shaft,
    wherein, in a case where said first drive arm rotates in a first rotation direction and said second drive arm rotates in a second rotation direction opposite to the first rotation direction, one substrate holder of said first substrate holder and said second substrate holder advances in a first direction such that the one substrate holder separates from a rotation axis of said first drive shaft, and the other substrate holder of said first substrate holder and said second substrate holder retreats in a second direction such that the other substrate holder returns to the rotation axis of said first drive shaft,
    a first direction axis, defined by a straight line which connects said first coupling portion and said second coupling portion to each other, is spaced apart from the rotation axis of said first drive shaft by a first distance, and
    a second direction axis, defined by a straight line which connects said third coupling portion and said fourth coupling portion to each other, is spaced apart from a rotation axis of said second drive shaft by a second distance.

2. The substrate transport apparatus according to claim 1, wherein the first distance is equal to the second distance.

3. The substrate transport apparatus according to claim 1, wherein
    said first substrate holder is within a first plane perpendicular to the rotation axis of said first drive shaft, and
    said second substrate holder is within a second plane perpendicular to the rotation axis of said first drive shaft,
    the second plane being parallel to the first plane, and being different from a position of the first plane in the direction of gravity.

4. The substrate transport apparatus according to claim 3, wherein said first substrate holder and said second substrate holder do not overlap each other in a rotation axis direction of said first drive shaft.

5. The substrate transport apparatus according to claim 1, further comprising:
    a first drive unit configured to rotate said first drive shaft;
    a second drive unit configured to rotate said second drive shaft;
    a first detection unit configured to detect a rotation angle and a rotation speed of said first drive unit;
    a second detection unit configured to detect a rotation angle and a rotation speed of said second drive unit; and
    a control unit configured to control said first drive unit and said second drive unit based on the detection results obtained by said first detection unit and said second detection unit, respectively.

6. The substrate transport apparatus according to claim 1, wherein
    said first substrate holder is capable of an advancing/retreating operation of advancing in the first direction, in which said first substrate holder separates from the rotation axis of said first drive shaft, or retreating in the second direction, in which said first substrate holder returns to the rotation axis of said first drive shaft, as said first pair of driven arms move with rotation of said first drive arm and said second drive arm, and
    said second substrate holder is capable of an advancing/retreating operation of advancing in a third direction, in which said second substrate holder separates from the rotation axis of said first drive shaft, or retreating in a fourth direction, in which said second substrate holder returns to the rotation axis of said first drive shaft, as said second pair of driven arms move with rotation of said first drive arm and said second drive arm,
    the advancing/retreating operations of said first substrate holder and said second substrate holder following different tracks.

7. A system for manufacturing an electronic device, comprising:
    a substrate transport apparatus defined in claim 1; and
    at least one process apparatus which executes a device manufacturing process for a substrate transported by said substrate transport apparatus.

8. A method of manufacturing an electronic device, comprising:
    a transport step of transporting a substrate using a substrate transport apparatus defined in claim 1; and a process execution step of executing a device manufacturing process for the substrate, transported in the transport step, in at least one process apparatus.

\* \* \* \* \*